United States Patent
Hopper et al.

(10) Patent No.: US 6,806,529 B1
(45) Date of Patent: Oct. 19, 2004

(54) MEMORY CELL WITH A CAPACITIVE STRUCTURE AS A CONTROL GATE AND METHOD OF FORMING THE MEMORY CELL

(75) Inventors: Peter J. Hopper, San Jose, CA (US); Yuri Mirgorodski, Sunnyvale, CA (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/356,422

(22) Filed: Jan. 30, 2003

(51) Int. Cl.⁷ .............................................. H01L 29/72
(52) U.S. Cl. ....................... 257/314; 257/315; 257/316; 257/357; 257/369; 438/257; 438/396; 438/688; 438/689; 438/526; 438/745
(58) Field of Search ................................ 257/314, 315, 257/316, 357, 369; 438/257, 396, 688, 689, 526, 745

(56) References Cited

U.S. PATENT DOCUMENTS 5,761,126 A   6/1998  Chi et al. .............. 365/185.27
6,528,842 B1 * 3/2003  Luich et al. ................. 257/315

OTHER PUBLICATIONS

Dae M. Kim et al., "Stacked Gate Mid–Channel Injection Flash EEPROM Cell–Part 1: Programming Speed and Efficiency Versus Device Structure", IEEE Transactions on Electron Devices, vol. 45, No. 8, Aug. 1998, pps. 1696–1702.

* cited by examiner

Primary Examiner—Edward Wojciechowicz
(74) Attorney, Agent, or Firm—Mark C. Pickering

(57) ABSTRACT

In an electrically programmable non-volatile memory cell, the first terminal of a high density capacitive structure is electrically connected to a conductive structure to form a floating gate/first electrode, while the second terminal of the capacitive structure is used as a control gate, providing a cell with a high overall capacitive coupling ratio, a relatively small area, and a high voltage tolerance.

20 Claims, 13 Drawing Sheets

MEMORY CELL WITH A CAPACITIVE STRUCTURE AS A CONTROL GATE AND METHOD OF FORMING THE MEMORY CELL

DETAILED DESCRIPTION OF THE INVENTION

Figure 1:
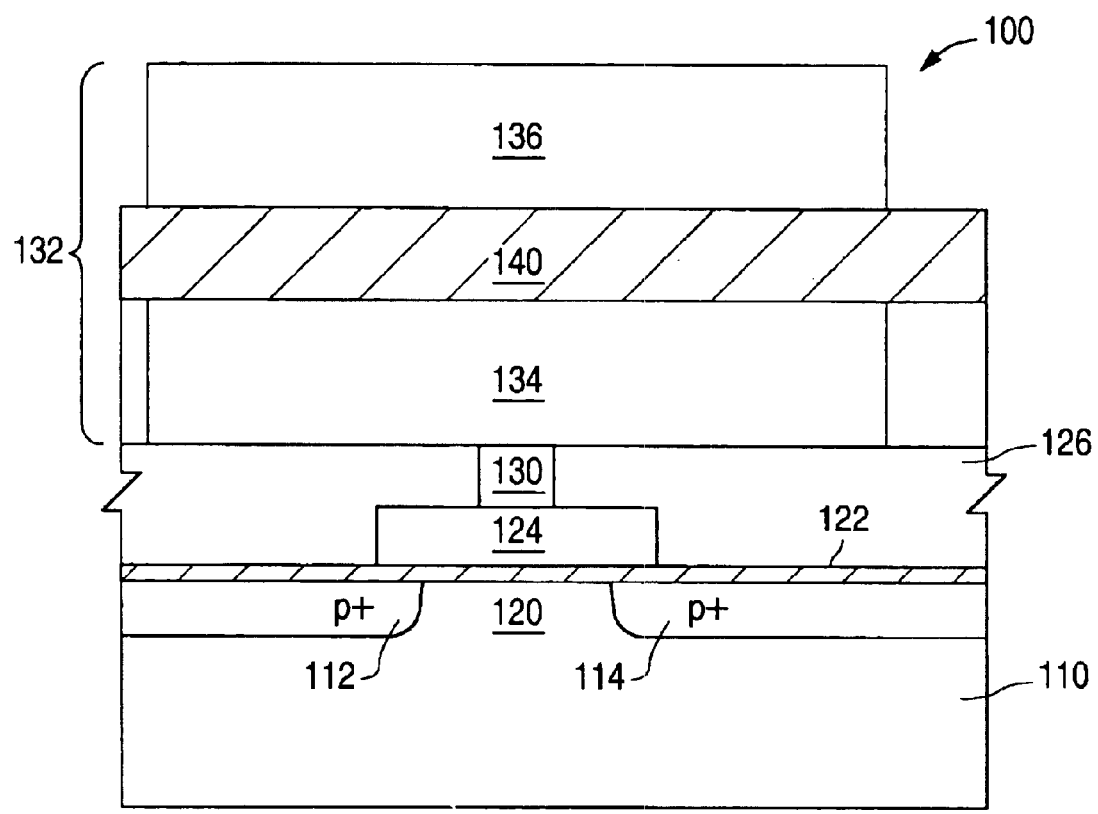
FIG. 1 is a cross-sectional view illustrating an example of a memory cell 100 in accordance with the present invention.

FIG. 1 shows a cross-sectional view that illustrates an example of a memory cell 100 in accordance with the present invention. As shown in the FIG. 1 example, memory cell 100 is formed in an n-type semiconductor material 110, such as a well or a substrate, and includes spaced apart p+source and drain regions 112 and 114, respectively, that are formed in semiconductor material 110. In addition, a channel region 120 is located between source and drain regions 112 and 114 in semiconductor material 110.

As further shown in FIG. 1, memory cell 100 also includes a layer of insulating material 122, such as gate or tunnel oxide, that is formed over channel region 120 on semiconductor material 110, and a first conductive structure 124 that is formed on insulating layer 122 over channel region 120. First conductive structure 124 can be implemented with, for example, doped polysilicon.

Memory cell 100 additionally includes a layer of isolation material 126 that is formed on first conductive structure 124, and a conductive contact 130 that is formed through isolation layer 126 to make an electrical connection with first conductive structure 124. Memory cell 100 also includes a capacitive structure 132 that is electrically connected to first conductive structure 124.

Capacitive structure 132, in turn, has a second conductive structure 134, a third conductive structure 136, and a dielectric material 140 that is formed between the first and second structures 134 and 136. In the example shown in FIG. 1, the second conductive structure 134 is electrically connected to first conductive structure 124 through conductive contact 130.

The first and second conductive structures 124 and 134 and conductive contact 130 function both as a floating gate which is not electrically connected to any other conductor, and as the first electrode of capacitive structure 132. The third conductive structure 136, in turn, functions as the second electrode of capacitive structure 132.

In operation, memory cell 100 can be programmed by applying a positive voltage supply to semiconductor material 110 and source region 112, ground to drain region 114, and a programming voltage to second electrode 136. Under these conditions, holes are accelerated from source region 112 to drain region 114 under the influence of the source-to-drain electric field. The accelerated holes have ionizing collisions with the lattice which, in turn, generates hot electrons. Some of the hot electrons penetrate insulating layer 122 and accumulate on first conductive structure 124, thereby programming cell 100.

Memory cell 100 can be erased by applying ground to source region 112, drain region 114, and second electrode 136, while applying an erase voltage to semiconductor material 110. Under these conditions, electrons tunnel from first conductive structure 124 to semiconductor material 110 through insulating layer 122 via the well-known Fowler-Nordheim tunneling mechanism.

Memory cell 100 can be read by applying the positive voltage supply to semiconductor material 110 and source region 112, ground to drain region 114, and a read voltage to second electrode 136. Under these conditions, holes flow from source region 112 to drain region 114 when cell 100 has not been programmed, and do not flow when cell 100 has been programmed. The logic state held by cell 100 is then determined by detecting the absence or presence of a hole flow.

In a first embodiment of memory cell 100, capacitive structure 132 is formed as a part of a conventional back end metallization process. In this embodiment, second conductive structure 134 is a patterned region from a first layer of metal (metal-1), material 140 is a layer of inter-metal dielectric, and third conductive structure 136 is a patterned region from a second layer of metal (metal-2).

For example, second and third conductive structures 134 and 136 can be approximately four microns thick, while dielectric material 140 can be approximately 0.7 microns thick. The first embodiment can be used to produce a simple, low cost memory cell in a standard single poly process with no additional mask steps.

In a second embodiment of memory cell 100, dielectric material 140 can alternately be implemented as a composite structure, such as oxide-nitride-oxide (ONO), while third conductive structure 136 can be formed by using a non-standard metal layer.

Figure 2A:
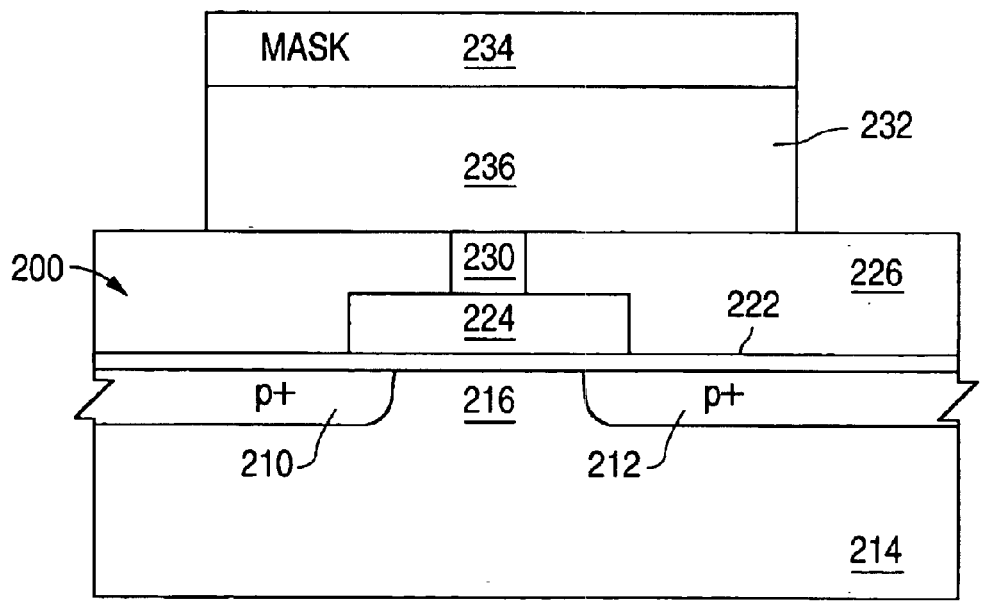
FIGS. 2A–2C are cross-sectional views illustrating an example of a method of forming a memory cell in accordance with the present invention.
Figure 2B:
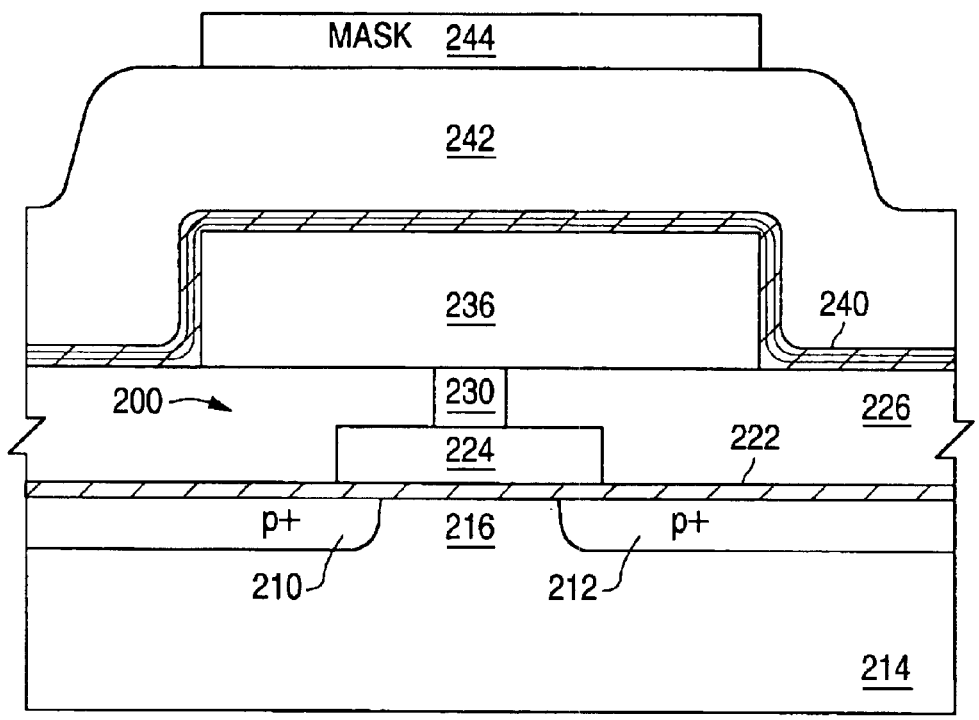
Figure 2C:
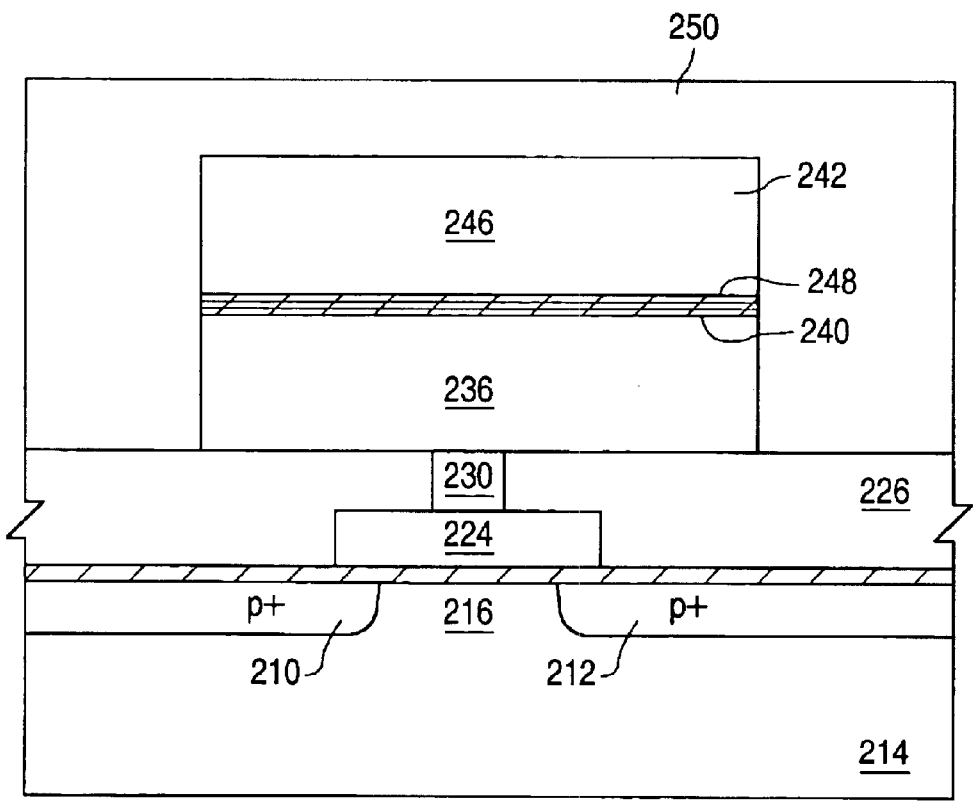

FIGS. 2A–2C show cross-sectional views that illustrate an example of a method of forming a memory cell in accordance with the present invention. As shown in FIG. 2A, the method utilizes a conventionally formed structure 200 that includes spaced apart p+ source and drain regions 210 and 212, respectively, that are formed in an n-semiconductor material 214, and a channel region 216 that is located between source and drain regions 210 and 212 in semiconductor material 214.

Structure 200 also includes an insulating layer 222, such as gate or tunnel oxide, that is formed on semiconductor material 214 over channel region 216, and a first conductive structure 224 that is formed on insulating layer 222 over channel region 216. In addition, a layer of isolation material 226 is formed on first conductive structure 224, and a conductive contact 230 is formed through isolation layer 226 to make an electrical connection with first conductive structure 224.

As further shown in FIG. 2A, the method begins by forming a first layer of metal (metal-1) 232 on isolation layer 226 to make an electrical connection with contact 230. Following this, a mask 234 is formed and patterned on metal-1 layer 232. Next, the exposed regions of metal-1 layer 232 are etched to form a second conductive structure 236. Mask 234 is then removed.

Once mask 234 has been removed, as shown in FIG. 2B, an insulation layer 240 is formed by sequentially forming layers of oxide, nitride, and oxide on second conductive structure 236. After insulation layer 240 has been formed, a second layer of metal 242 is formed on insulation layer 240. Following this, a mask 244 is formed and patterned on metal layer 242.

As shown in FIG. 2C, the exposed regions of metal layer 242 and insulation layer 240 are then etched. The etch forms a stacked metal gate structure that includes a third conductive structure 246, an underlying insulation structure 248, and second conductive structure 236. Following this, mask 244 is removed.

Next, as further shown in FIG. 2C, a layer of insulation material 250 is formed on isolation layer 226 and third conductive structure 246. The layer of insulation material 250 is then planarized. Following this, the method continues with conventional steps, with a via being formed through insulation layer 250 to make an electrical connection with second conductive structure 246.

Although requiring additional processing steps, the second embodiment of cell 100 provides a much higher capacitance, for example, of approximately one femtofarad (fF) per square micron of surface area due to a thinner dielectric layer. By comparison, the first embodiment provides a lower capacitance, for example, of approximately 0.1 fF per square micron of surface area.

Figure 3A:
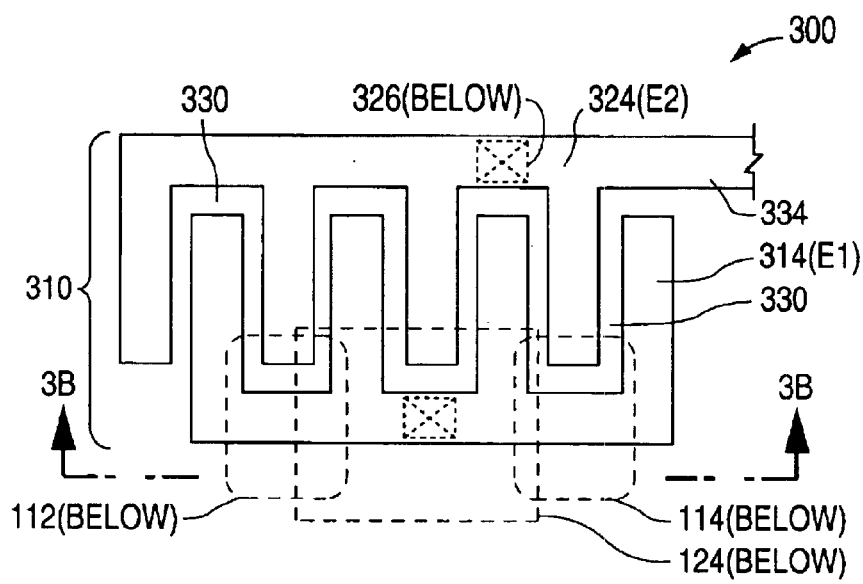
FIGS. 3A–3B are views illustrating an example of a memory cell 300 in accordance with the present invention.
Figure 3B:
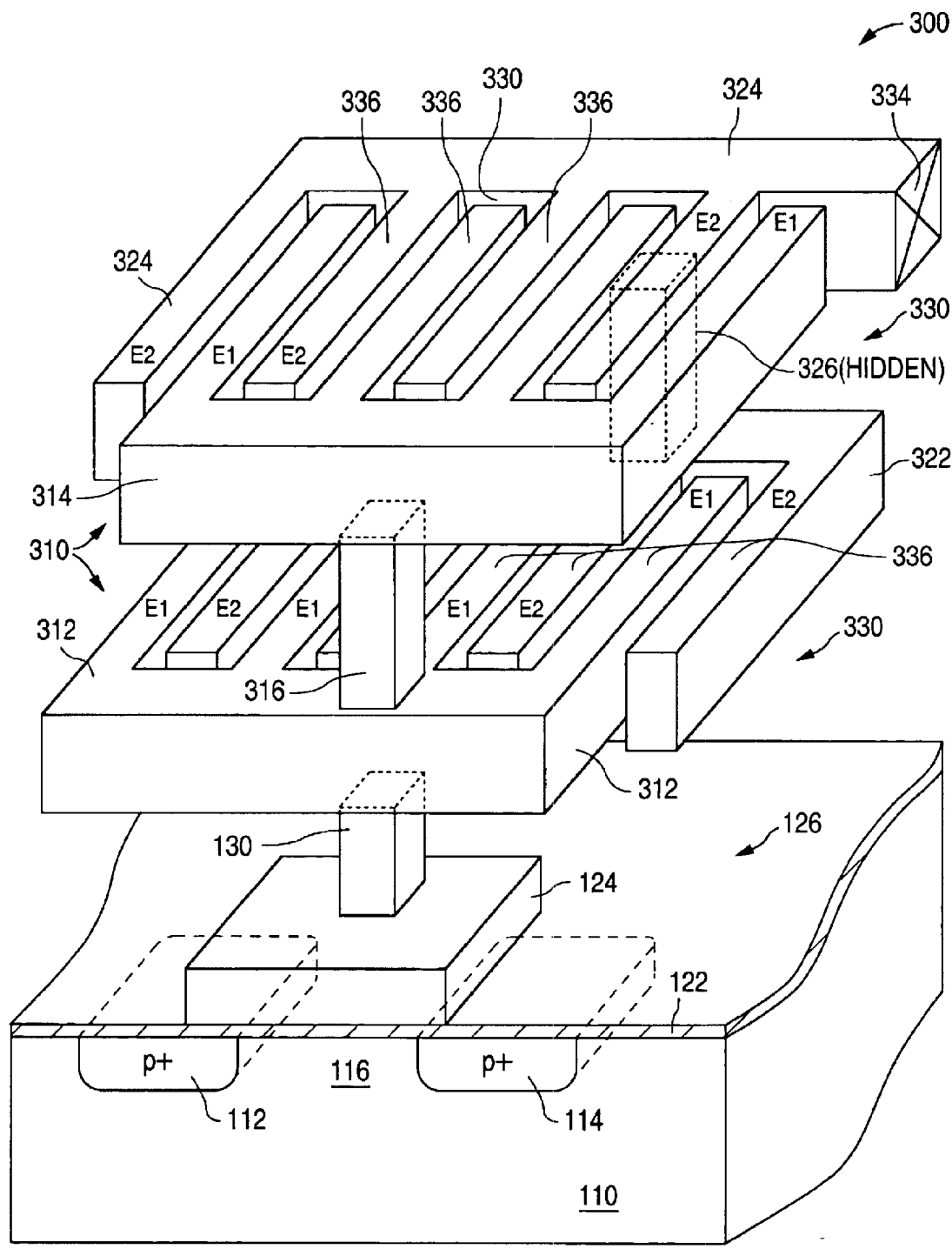

FIGS. 3A and 3B show views that illustrate an example of a memory cell 300 in accordance with the present invention. FIG. 3A is a plan view, while FIG. 3B is a cross-sectional perspective view taken along lines 3B–3B of FIG. 3A. Memory cell 300 is similar to cell 100 and, as a result, utilizes the same reference numerals to designate the structures which are common to both cells.

As shown in FIGS. 3A and 3B, cell 300 differs from cell 100 in that cell 300 utilizes a capacitive structure 310 in lieu of structure 132. Capacitive structure 310 has second and third conductive structures E1 and E2, respectively, that are interdigitated. Second conductive structure E1 includes a patterned region 312 that is formed from a first layer of metal (metal-1), and a patterned region 314 that is formed from a second layer of metal (metal-2) that overlies patterned region 312. (Second conductive structure E1 can also include patterned regions from other metal layers.) In addition, a conductive via 316 connects patterned region 314 to patterned region 312 which, in turn, is connected to first conductive structure 124 through conductive contact 130.

Third conductive structure E2 includes a patterned region 322 that is formed from the first layer of metal (metal-1), and a patterned region 324 that is formed from the second layer of metal (metal-2) that overlies patterned region 322. (Third conductive structure E2 can also include patterned regions from other metal layers.) Further, conductive via 326 connects patterned region 322 to patterned region 324 which, in turn, is connected to receive a programming voltage through, for example, a conductor 334.

As further shown in FIGS. 3A–3B, each patterned region 312, 314, 322, and 324 has a base and a number of fingers 336 that extend away from the base. The fingers 336 of regions 312 and 322 are horizontally adjacent, interdigitated, and separated by a dielectric material 330 that also separates the first metal layer from the second metal layer. In addition, the fingers of regions 314 and 324 are horizontally adjacent, interdigitated, and separated by a dielectric material.

The first conductive structure 124, conductive contact 130, patterned regions 312 and 314, and via 316 function both as a floating gate which is not electrically connected to any other conductor, and as the first electrode of capacitive structure 310. Patterned regions 322 and 324 and via 326, in turn, function as the second electrode of capacitive structure 310.

Memory cell 300 operates in the manner described for memory cell 100. As in memory cell 100, capacitive structure 310 is formed during the conventional metallization process, requiring no additional mask steps. The high density of capacitive structure 310 provides a capacitance value of about 0.8 fF per square micron of area, and allows memory cell 300 to be used with relatively high voltages.

Figure 4A:
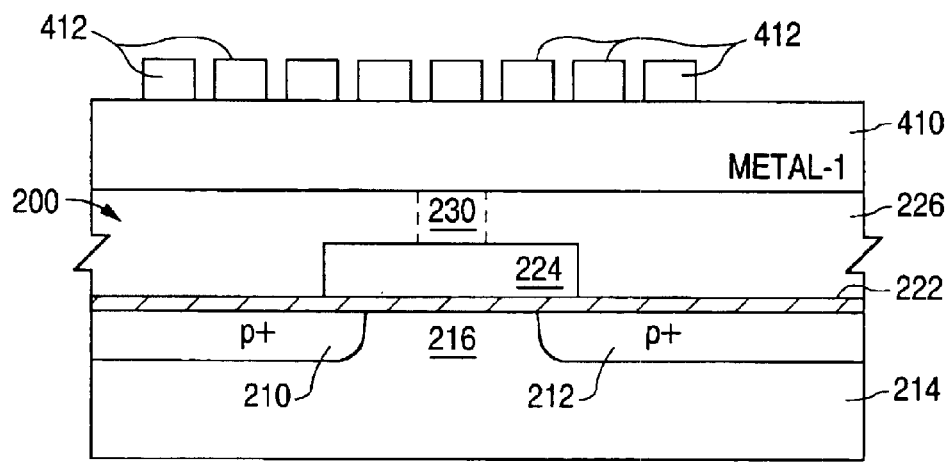
FIGS. 4A–4C are cross-sectional views illustrating an example of a method of forming a memory cell in accordance with the present invention.
Figure 4B:
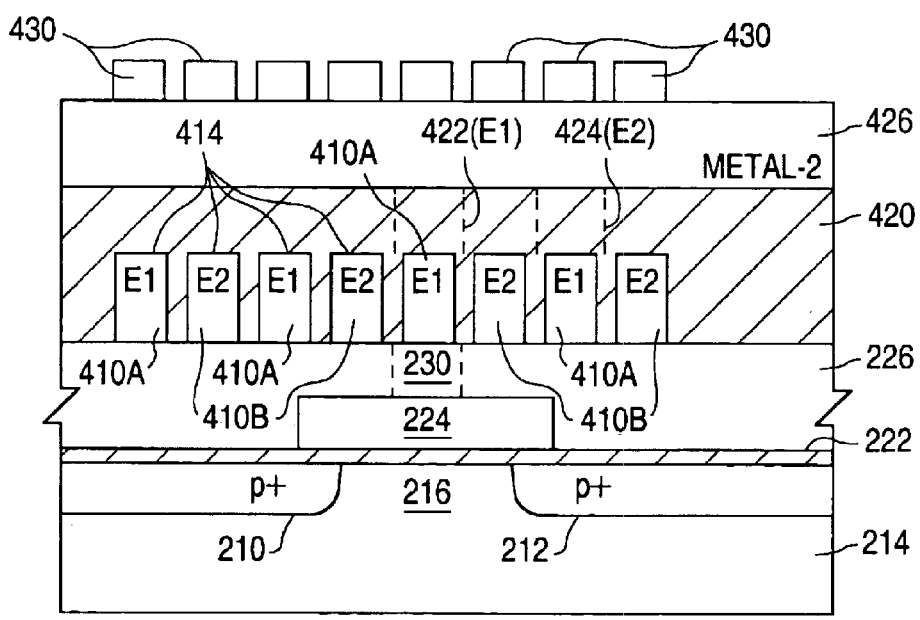
Figure 4C:
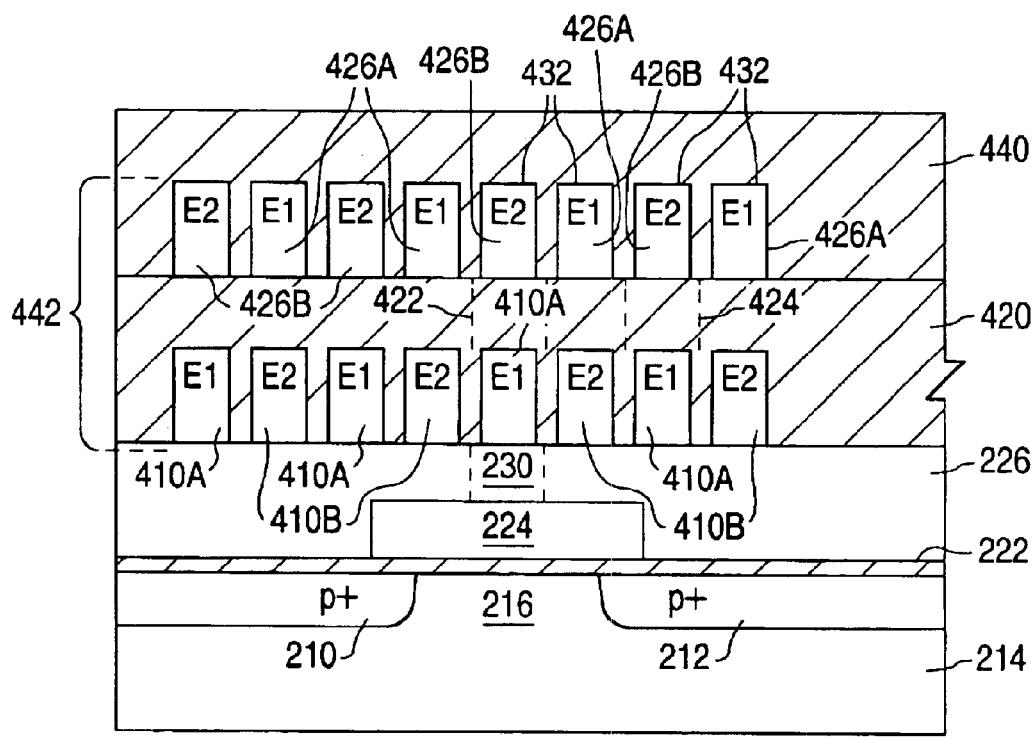

FIGS. 4A–4C show cross-sectional views that illustrate an example of a method of forming a memory cell in accordance with the present invention. As shown in FIG. 4A, the method, which also utilizes structure 200, begins by forming a first layer of metal (metal-1) 410 on isolation layer 226 and conductive contact 230. Following this, a mask 412 is formed and patterned on metal-1 layer 410.

Next, as shown in FIG. 4B, the exposed regions of the metal-1 layer (410) are etched to form a first section 410A and a spaced-apart second section 410B. Mask 412 is then stripped. First section 410A forms part of a second conductive structure E1 of the to-be-formed capacitive structure, while second section 410B forms part of a third conductive structure E2 of the to-be-formed capacitive structure.

Sections 410A and 410B are both formed in a comb configuration, having a plurality of fingers 414 that are connected to a perpendicular base segment in the same manner as shown in FIG. 3B. The fingers 414 of section 410A are interdigitated with the fingers 414 of section 410B in the same manner as sections 312 and 322 shown in FIG. 3B.

As shown in FIG. 4B, after sections 410A and 410B have been formed and mask 412 has been removed, a layer of inter-metal dielectric material 420 is formed on sections 410A and 410B and isolation layer 226. Dielectric material 420 fills the spaces between sections 410A and 410B.

Next, a first conductive via 422 is formed through dielectric layer 420 to make an electrical connection with section 410A, while a second conductive via 424 is formed through dielectric layer 420 to make an electrical connection with section 410B. After vias 422 and 424 have been formed, a second layer of metal (metal-2) 426 is formed on dielectric material 420, and conductive vias 422 and 424. Following this, a mask 430 is formed and patterned on metal-2 layer 426.

As shown in FIG. 4C, the exposed regions of metal-2 layer 426 are etched to form a first section 426A and spaced-apart second section 426B. Mask 430 is then stripped. First section 426A forms a part of second conductive structure E1 of the to-be-formed capacitive structure, while second section 426B forms part of third conductive structure E2 of the to-be-formed capacitive structure. Sections 426A and 426B are both formed in a comb configuration, having a plurality of fingers 432 that are connected to a perpendicular base segment in the same manner as shown in FIG. 3B.

The fingers 432 of section 426A are interdigitated with the fingers 432 of section 426B in the same manner as sections 314 and 324 shown in FIG. 3B. The perpendicular base segment of section 426A is connected to section 410A with via 422, while the perpendicular base segment of section 426B is connected to section 410B with via 424.

During the masking and etching process, metal-2 layer 426 can also be patterned to form a conductive trace which can connect structure E2 to a control voltage to operate the memory cell. Alternately, structure E2 can be connected to a control voltage through a via and a conductor formed on another metal layer.

Next, a second layer of inter-metal dielectric material 440 is formed on sections 426A and 426B, to fill the spaces between sections 426A and 426B and electrically isolate the structures E1 and E2. Second conductive structure E1, third conductive structure E2, and the surrounding dielectric material thus form a capacitive structure 442. Following this, the method continues with conventional semiconductor fabrication steps. Although capacitive structure 442 is shown with only two metal levels, structure 442 can include vias and sections from additional metal layers.

Figure 5A:
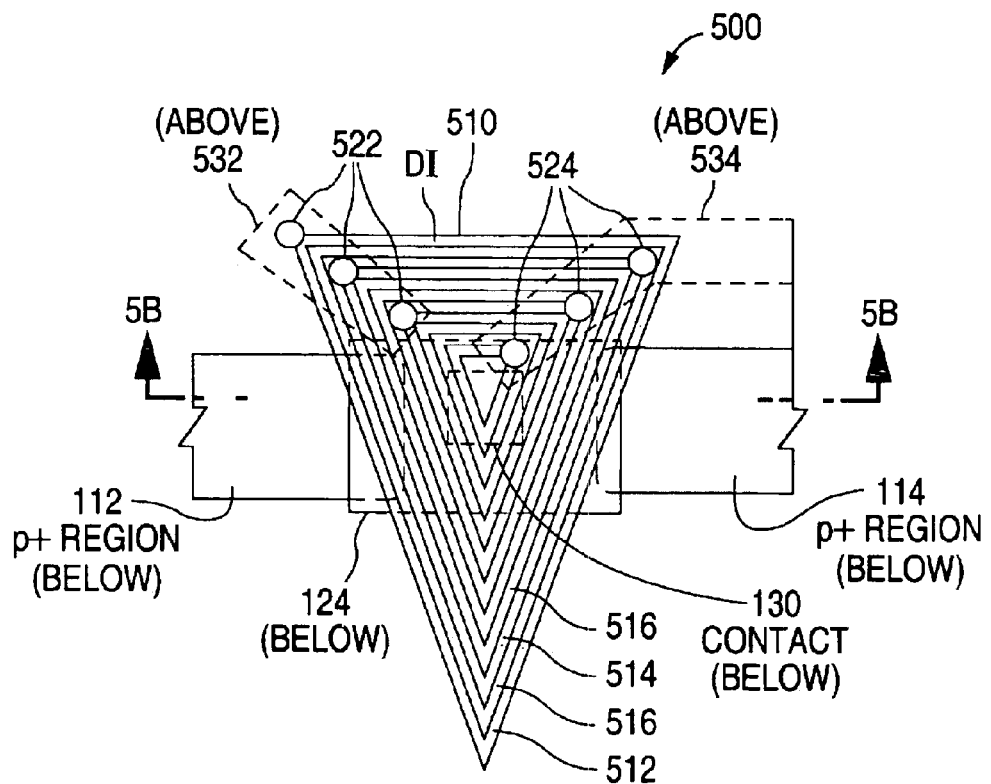
FIGS. 5A and 5B are views illustrating an example of a memory cell 500 in accordance with the present invention.
Figure 5B:
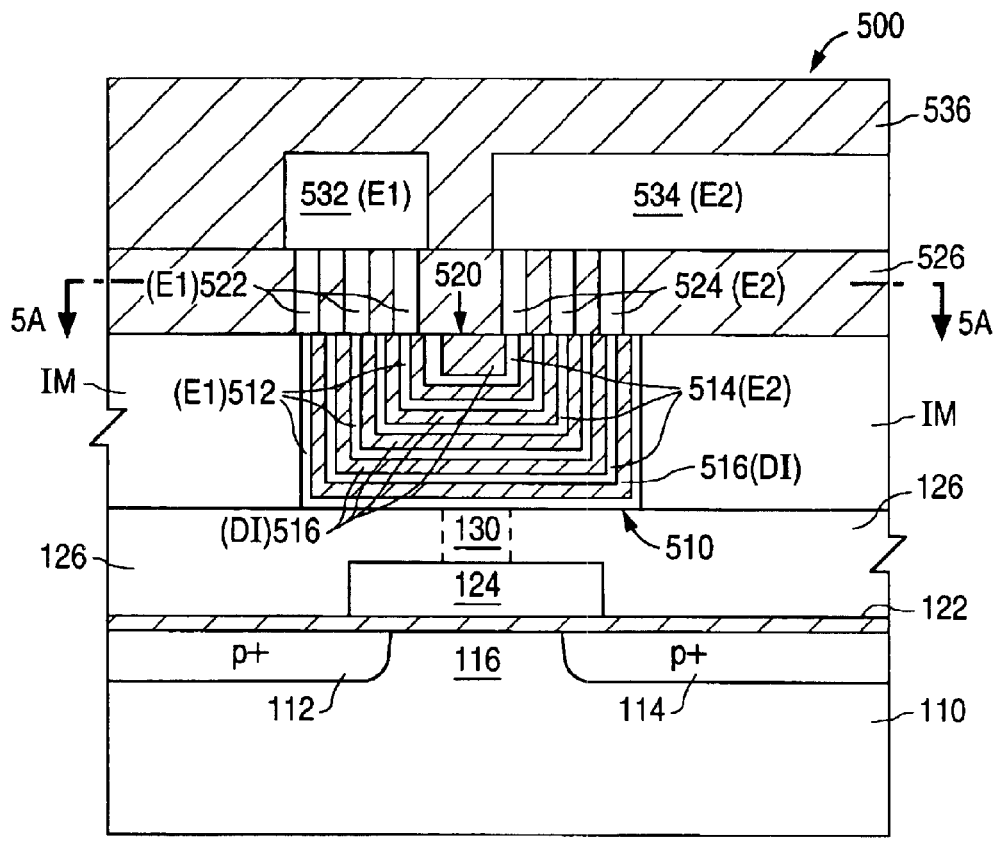

FIGS. 5A and 5B show views that illustrate an example of a memory cell 500 in accordance with the present invention. FIG. 5A is a plan view taken along lines 5A–5A of FIG. 5B, while FIG. 5B is a cross-sectional view taken along lines 5B–5B of FIG. 5A. Memory cell 500 is similar to cell 100 and, as a result, utilizes the same reference numerals to designate the structures which are common to both cells.

As shown in FIGS. 5A and 5B, cell 500 differs from cell 100 in that cell 500 utilizes a high density capacitive structure 510 in lieu of structure 132. Structure 510 has a second conductive structure E1, a third conductive structure E2, and a dielectric DI that separates and electrically isolates structures E1 and E2 from each other.

Second and third conductive structures E1 and E2 are formed from alternating thin conductive layers that are separated by thin dielectric layers. Second conductive structure E1 includes first conductive layers 512 (representing the first, third, fifth, etc. conductive layers). Third conductive structure E2 includes second conductive layers 514 (representing the second, fourth, sixth, etc. conductive layers). Dielectric DI includes dielectric layers 516 that are formed to isolate conductive layers 512 from conductive layers 514.

As further shown in FIGS. 5A and 5B, a layer of isolation material IM is formed on isolation layer 126 which has a trench formed therein. The trench has three or more sidewalls so that layers 512, 514, and 516 have vertical sections connected to horizontal bottom sections.

The first, outermost, conductive layer of the first conductive layers 512 is formed to make an electrical connection with contact 130 that is, in turn, electrically connected with first conductive structure 124. Capacitive structure 510 includes a top surface 520 at which the vertical sections of layers 512, 514, and 516 terminate. Top surface 520 exposes a surface of each of the first set of conductive layers 512 and the second set of conductive layers 514.

Although the example illustrated in FIGS. 5A and 5B includes a total of six conductive layers in capacitive structure 510, the capacitance value of the structure can be altered by forming structure 510 with more conductive layers or fewer conductive layers. Similarly, the width and depth of capacitive structure 510 can be adjusted to modify its capacitance value.

Additionally, although capacitive structure 510 is shown as triangular in the plan view, other shapes are possible. However, a shape having acute angles will provide each of the conductive layers with an increased surface area for making contacts to the conductive layers at top surface 520.

In memory cell 500, conductive layers 512 and 514 include a conductive material, such as metal or doped polysilicon, that is formed to a thickness of about 1,200Å. The dielectric layers 516, in turn, include a material such as silicon dioxide that is formed to a thickness of about 1,000 Å.

In addition, memory cell 500 includes an isolation material 526 that is formed on isolation material IM and capacitive structure 510. Memory cell 500 further includes a plurality of conductive contacts, including first contacts 522 and second contacts 524, that are formed through isolation material 526.

The first contacts 522 are formed to make an electrical connection to each of the first conductive layers 512 (layers 1, 3, 5, etc.), while the second contacts 524 are formed to make an electrical connection to each of the second conductive layers 514 (layers 2, 4, 6, etc.).

Memory cell 500 further includes a first conductor 532 that is formed on the first contacts 522 to make an electrical connection with the first conductive layers 512, and a second conductor 534 that is formed on the second contacts 524 to make an electrical connection with the second conductive layers 514. A layer of isolation material 536 is also formed to electrically isolate conductor 532 from 534.

First conductor 532, first contacts 522, first conductive layers 512, conductive contact 130, and first conductive structure 124 form a floating gate/first electrode that is electrically isolated from all other conductors. Second conductor 534, second contacts 524, and second conductive layers 514 form a second electrode E2, which can be connected to a circuit to operate the cell. Conductive contacts 532 and 534, and conductors 522 and 524 are formed from metal; conductors 532 and 534 can be formed from, for example, the metal-1layer.

Memory cell 500 operates in the manner described for memory cell 100. By forming capacitive structure 510 with ten conductive layers and an overall depth of 2–3 microns, a capacitance value of about 10$f$F per square micron of area can be achieved. Further, the configuration of the structure allows memory cell 500 to be used with relatively high voltages.

Figure 5C:
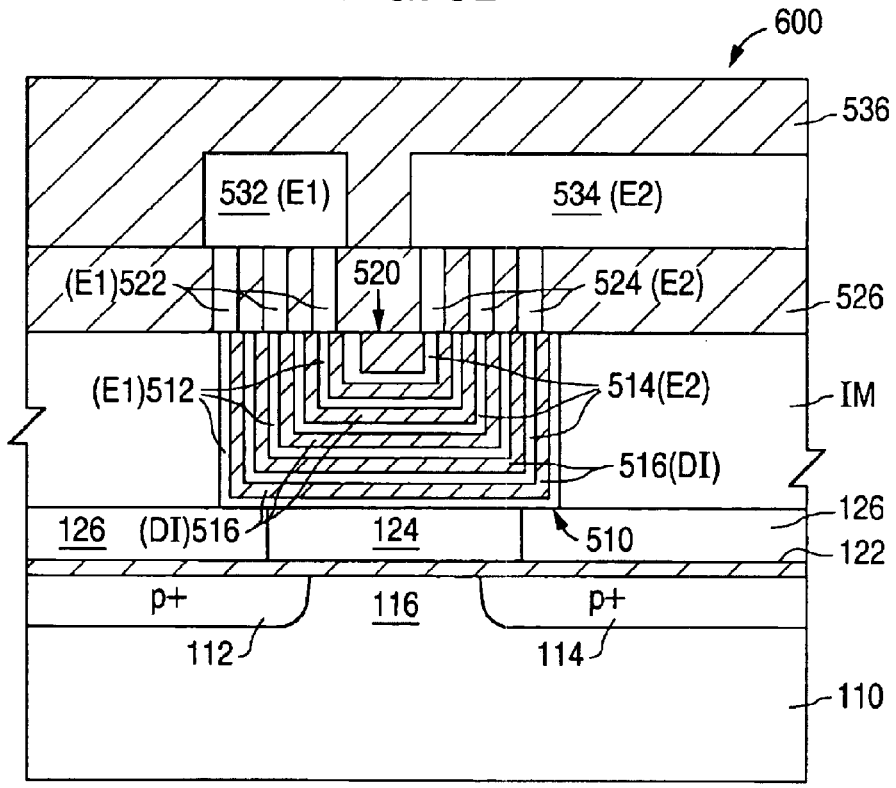
FIG. 5C is a cross-sectional view illustrating an example of a memory cell 600 in accordance with the present invention.

FIG. 5C shows a cross-sectional view that illustrates an example of a memory cell 600 in accordance with an alternate embodiment of the present invention. Memory cell 600 is similar to cell 500 and, as a result, utilizes the same reference numerals to designate the structures which are common to both cells.

Memory cell 600 differs from cell 500 in that contact 130 is omitted, and capacitive structure 510 is formed directly on first conductive structure 124. The conductive layers in cell 600 can include metallic materials and doped polysilicon. The capacitive value and voltage handling characteristics of cell 600 are similar to those of cell 500.

Figure 6A:
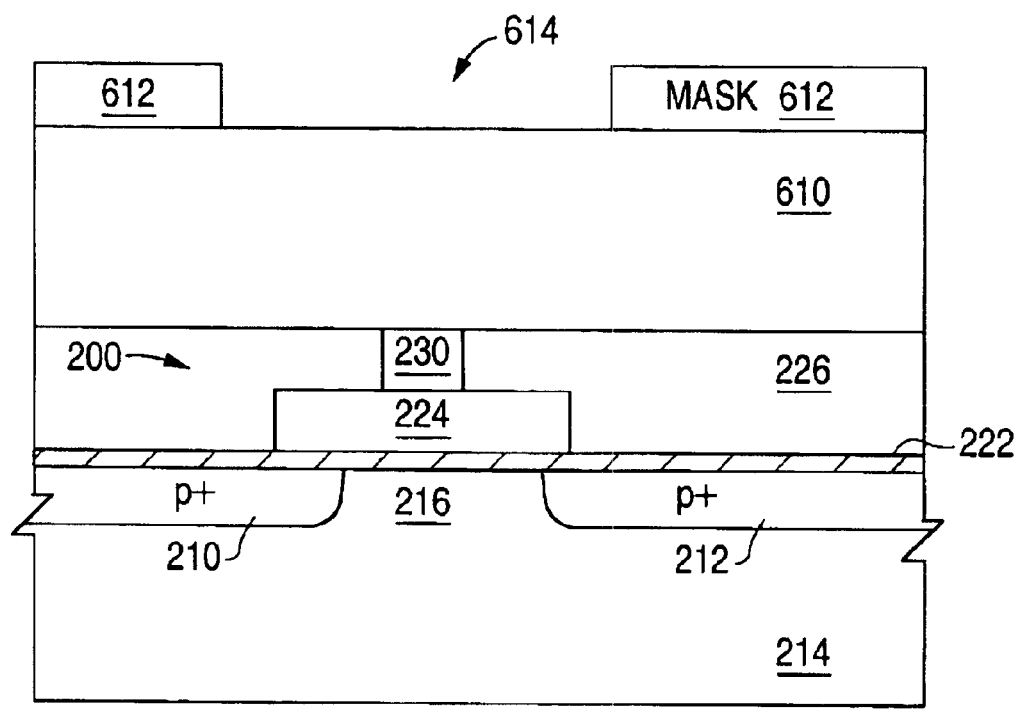
FIGS. 6A–6F are cross-sectional views illustrating an example of a method of forming a memory cell in accordance with the present invention.

FIGS. 6A–6F show cross-sectional views that illustrate an example of a method of forming a memory cell in accordance with the present invention. As shown in FIG. 6A, the method, which also utilizes structure 200, begins by forming a second layer of isolation material 610 on isolation material 226 and conductive contact 230.

Following this, a mask 612 is formed and patterned on isolation layer 610. Mask 612 is patterned to have a triangular-shaped opening 614 in plan view (the mask opening can be patterned in any shape, however, an opening having acute angles, such as a triangle or parallelogram, will increase the surface connection area of the conductive layers in the to-be-formed capacitive structure).

Figure 6B:
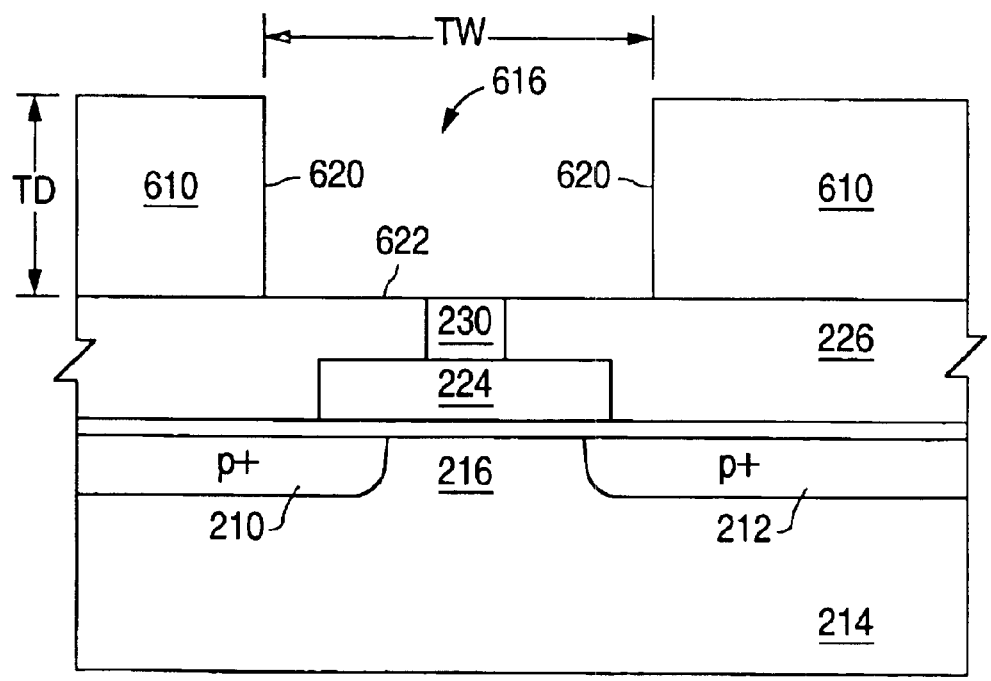

As shown in FIG. 6B, isolation layer 610 is then anisotropically etched to remove portions of the layer not protected by mask 612. Mask 612 is then removed. The etch process forms a trench 616 that has a plurality of sidewalls 620 and a bottom surface 622. Bottom surface 622, in turn, exposes the top surfaces of isolation material 226 and conductive contact 230.

Trench 616 has a depth TD and width TW which are selected to provide the capacitance value required by the device design. In the example, depth TD is equal to 2 μm, while width TW varies due to the triangular shape of trench 616 in plan view.

Figure 6C:
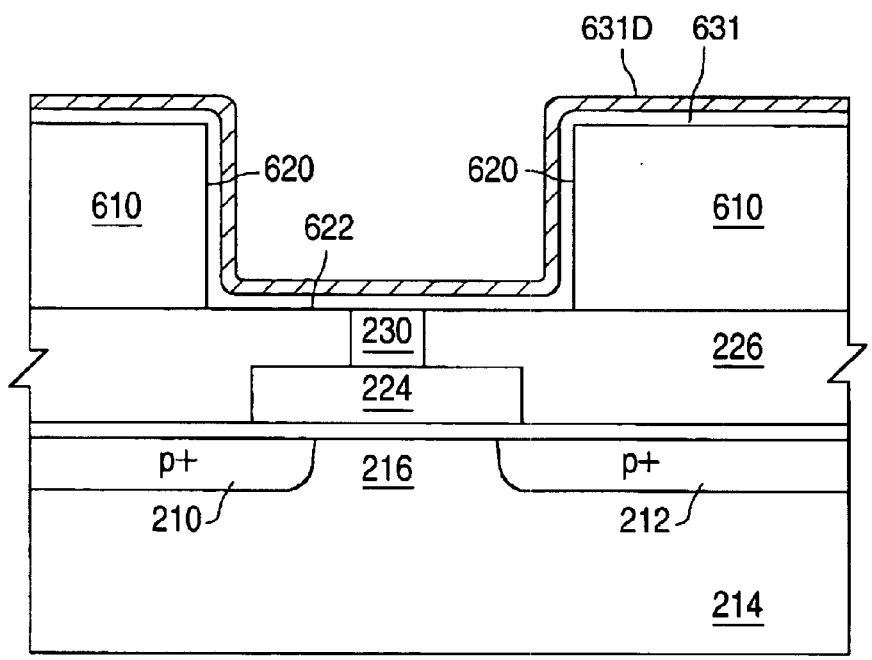

Turning to FIG. 6C, the method continues by depositing a first conformal conductive layer 631 on the exposed surfaces of isolation material 610, trench sidewalls 620, and trench bottom surface 622. First conformal conductive layer 631 and subsequently deposited conformal conductive layers can be formed to a thickness of about 1,200Å using a chemical vapor deposition process. In addition, first conformal conductive layer 631 and subsequently deposited conformal conductive layers can be formed from a metallic material, such as titanium nitride, or alternately, from polysilicon (doped in situ or following deposition).

Next, a first conformal layer of dielectric material 631D is deposited on the surface of first conductive layer 631. The first and subsequently formed conformal dielectric layers can include oxide, formed, for example, by plasma enhanced chemical vapor deposition of tetraethyl orthosilicate (PETEOS).

Figure 6D:
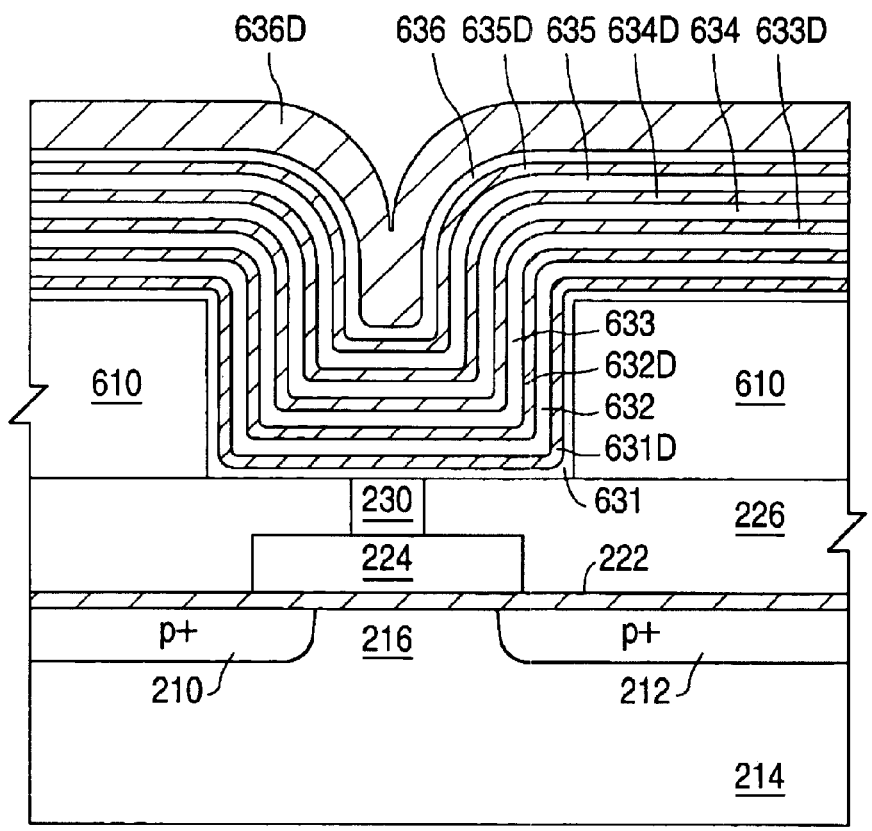
Figure 6E:
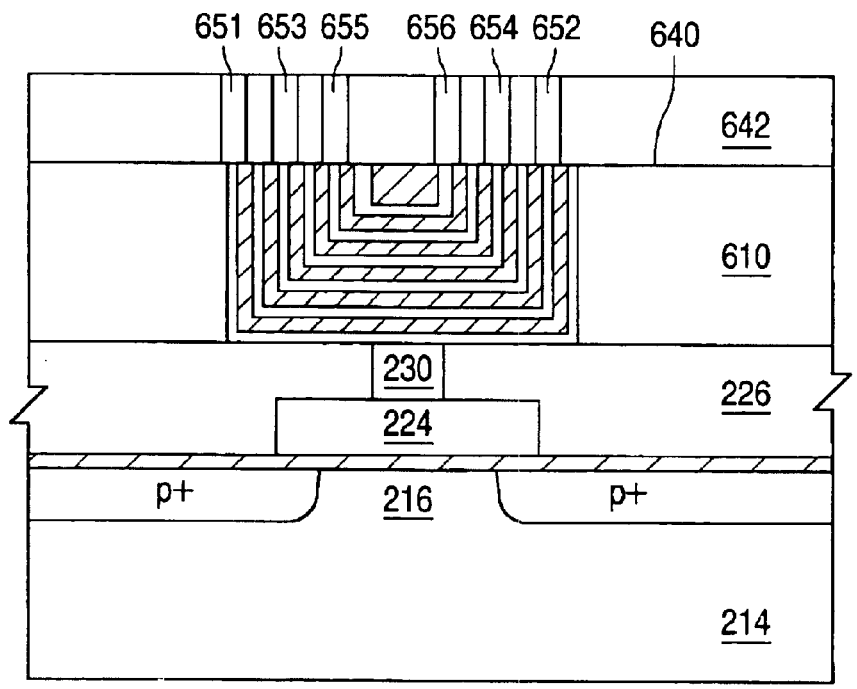

As shown in FIG. 6D, the method continues by sequentially forming alternating conformal conductive layers (632, 633, 634, 635, and 636) and conformal dielectric layers (632D, 633D, 634D, 635D, and 636D) until trench 616 is filled. Following this, the alternating conformal conductive and dielectric layers are planarized, as indicated in FIG. 6E, to create a planar surface 640.

Surface 640 includes the top surface of isolation material 610, the surface of conformal conductive layers 631-636, and the top surface of the dielectric layers 631D-636D. If trench 616 has been formed to have a triangular shape in plan view, each of the conformal conductive layers 631–636 will have a triangular shape in plan view. After the planarization step, an isolation layer 642 is formed on surface 640.

A plurality of conductive vias 651–656 are then formed through isolation layer 642 so that each via 651–656 contacts one of the conformal conductive layers 631–636. Conductive vias 651–656 can be formed on each of the conductive layers 631–636 at the apexes of the triangles, reducing the potential for misalignment of the via to the conductive layer.

Figure 6F:
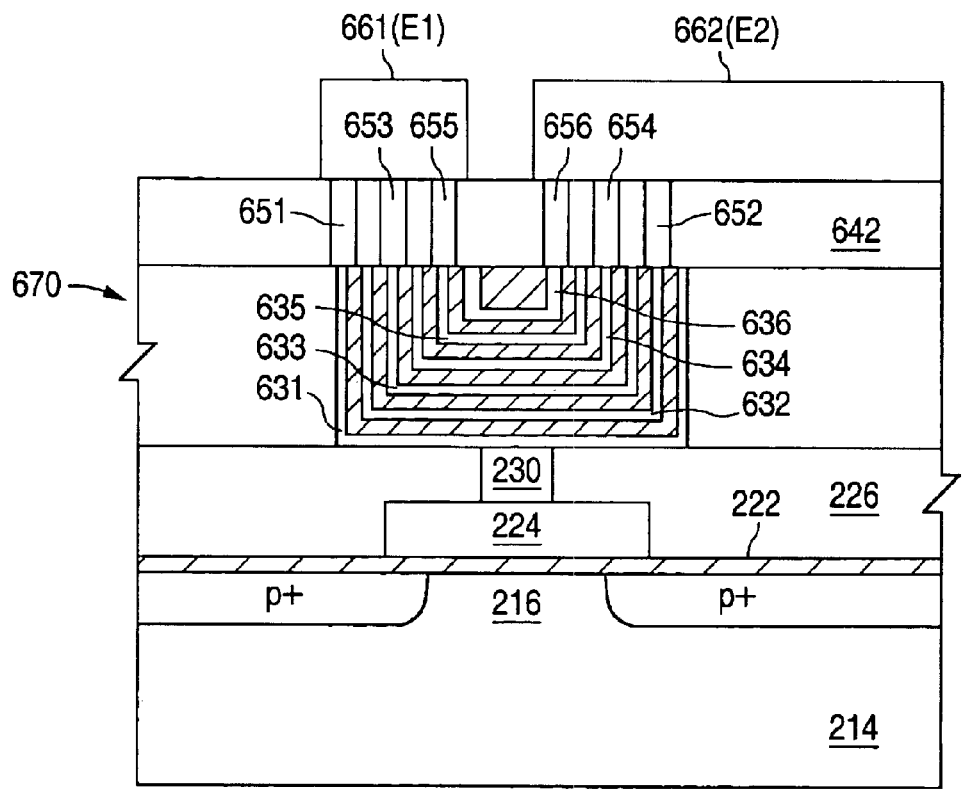

Next, as shown in FIG. 6F, a metal layer, such as the metal-1 layer, is formed on the surface of isolation layer 642 and conductive vias 651–656. The metal layer is masked and etched to form a first conductor 661 that is connected to conductive vias 651, 653, and 655. The etch process also forms a second conductor 662 that is connected to conductive vias 652, 654, and 656. Second conductor 662 can also be connected to a circuit to operate the cell.

Thus, a capacitive structure 670 is formed. The first conductive structure 224, conductive contact 230, conformal conductive layers 631, 633 and 635, conductive vias 651, 653, and 655, and first conductor 661 function both as a floating gate which is not electrically connected to any other conductor, and as the first electrode of capacitive structure 670. Conformal conductive layers 632, 634 and 636; conductive vias 652, 654, and 656; and second conductor 662, in turn, function as the second electrode of capacitive structure 670. (Capacitive structure 510 of cell 600 can be formed in the same manner except that opening 616 is formed to expose first conductive structure 224.)

Figure 7A:
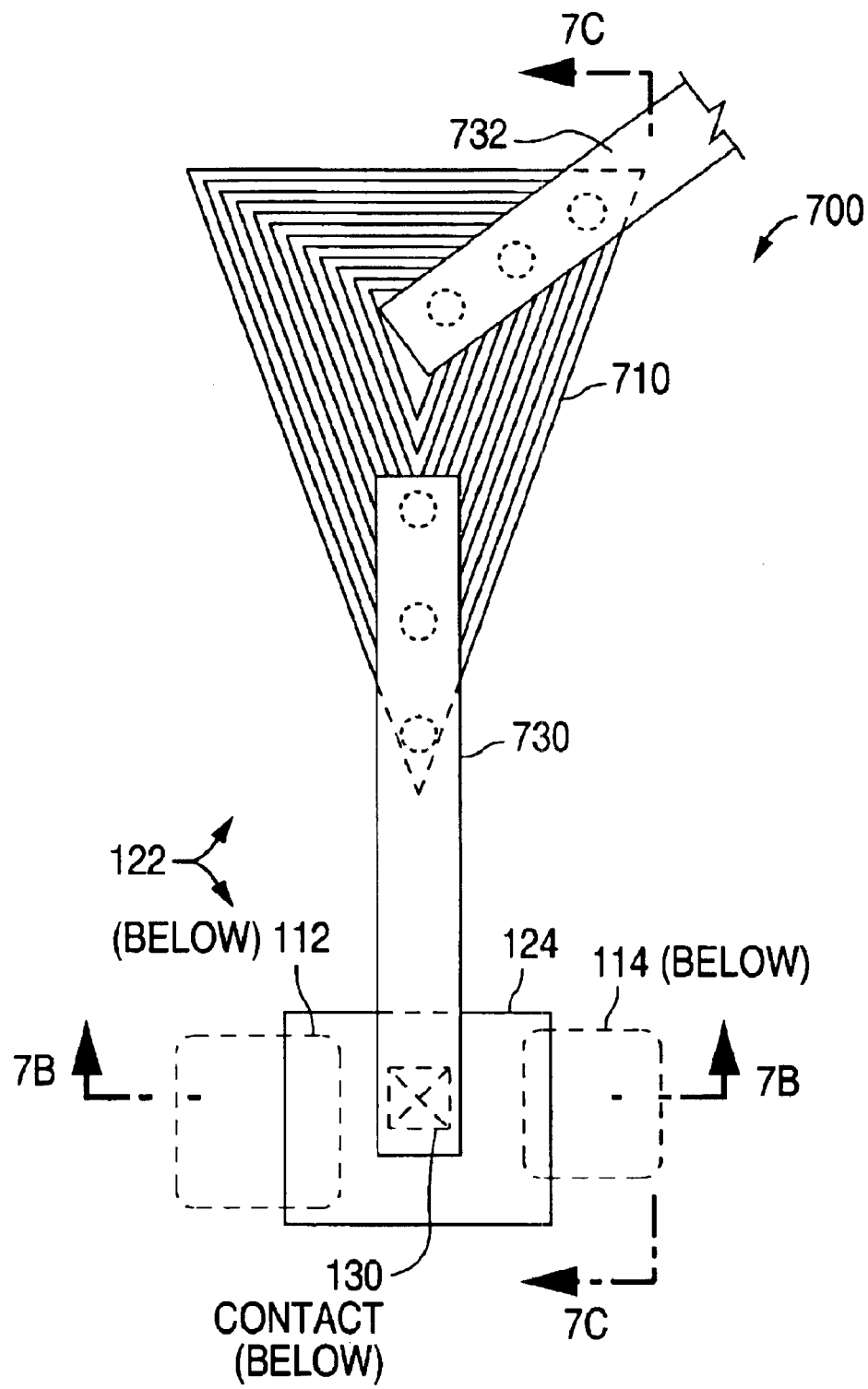
FIGS. 7A–7C are views illustrating an example of a memory cell 700 in accordance with the present invention.
Figure 7B:
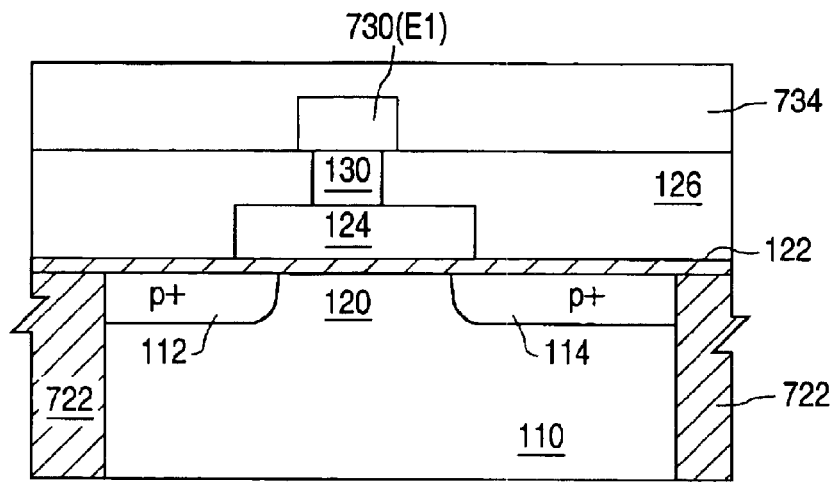
Figure 7C:
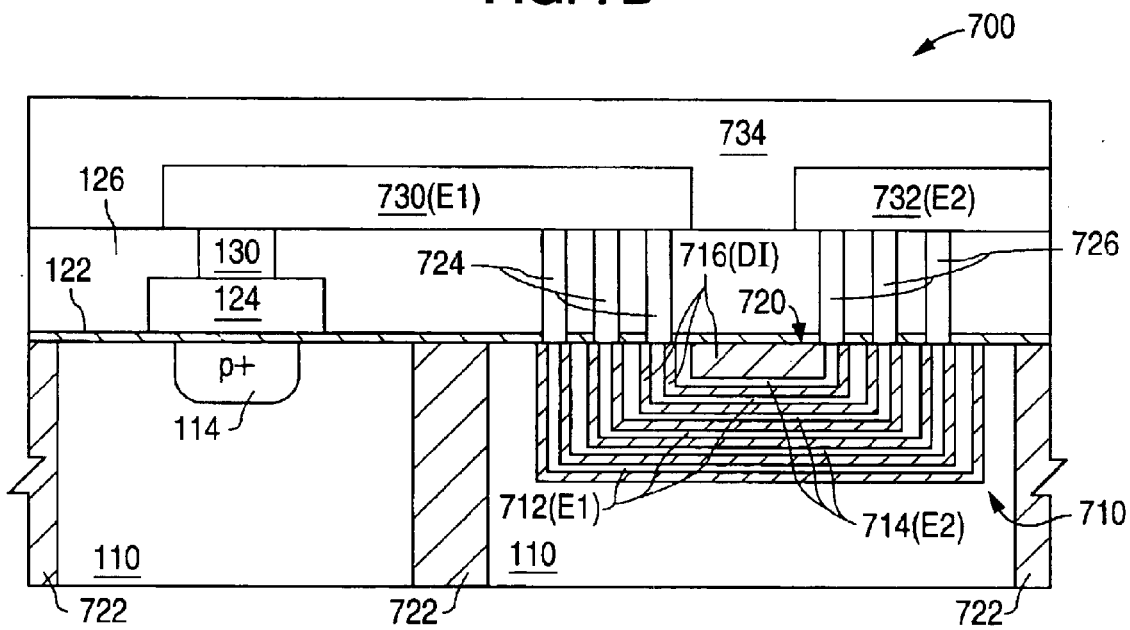

FIGS. 7A–7C show views that illustrate an example of a memory cell 700 in accordance with the present invention. FIG. 7A shows a plan view of memory cell 700. FIG. 7B shows a cross-sectional view taken along lines 7B–7B of FIG. 7A, while FIG. 7C shows a cross-sectional view taken along lines 7C–7C of FIG. 7A. Memory cell 700 is similar to cell 500 and, as a result, utilizes the same reference numerals to designate the structures which are common to both cells.

As shown in FIGS. 7A and 7B, cell 700 differs from cell 500 in that cell 700 utilizes a high density capacitive structure 710 in lieu of structure 510. In contrast with cell 500, capacitive structure 710 is formed in semiconductor material 110 rather than in the isolation material above first conductive structure 124. By forming capacitive structure 710 in semiconductor material 110, the surface area of cell 700 is increased, but the overall depth of cell 700 is reduced.

As shown in FIGS. 7A and 7C, capacitive structure 710 has a second conductive structure E1, a third conductive structure E2, and a dielectric DI that separates and electrically isolates structures E1 and E2 from each other. Second and third conductive structures E1 and E2 are formed from alternating thin conductive layers that are separated by thin dielectric layers.

Second conductive structure E1 includes first conductive layers 712 (representing the first, third, fifth, etc. conductive layers). Third conductive structure E2 includes second conductive layers 714 (representing the second, fourth, sixth, etc. conductive layers). Dielectric DI, in turn, includes thin dielectric layers 716 that are formed to isolate conductive layers 712 from conductive layers 714.

Layers 712, 714, and 716 are formed in a trench in semiconductor material 110. The trench is formed to have three or more sidewalls, so that when the alternating conductive and dielectric layers are deposited in the trench, each layer has a plurality of vertical sections connected to a horizontal bottom section.

Conductive layers 712 and 714 include a conductive material, such as doped polysilicon, that is formed to a thickness of about 1,200Å. The dielectric layers 716, in turn, include a material such as silicon dioxide that is formed to a thickness of about 1,000 Å.

Capacitive structure 710 includes a top surface 720 at which the vertical sections of layers 712, 714, and 716 terminate. Top surface 720 exposes a surface of each of the first conductive layers 712 and the second conductive layers 714. Although the example illustrated includes a total of six conductive layers in capacitive structure 710, the capacitance value of structure 710 can be altered by forming structure 710 with more conductive layers or fewer conductive layers.

In the example shown, cell 700 also includes a trench isolation region 722 that is formed in material 710. Region 722 laterally isolates the p+ source and drain regions 112 and 114, respectively, from capacitive structure 710.

In addition, memory cell 700 includes a plurality of conductive contacts, including first contacts 724 and second contacts 726, that are formed through isolation material 126.

The first contacts 724 are formed to make an electrical connection to each of the first conductive layers 712 (layers 1, 3, 5, etc.), while the second contacts 726 are formed to make an electrical connection to each of the second conductive layers 714 (layers 2, 4, 6, etc.).

Memory cell 700 further includes a first conductor 730 that is formed on isolation material 126 and the first contacts 724 to make an electrical connection with the first conductive layers 712, and a second conductor 732 that is formed on isolation material 126 and the second contacts 726 to make an electrical connection with the second conductive layers 714. The first conductor 730 is additionally electrically connected to first conductive structure 124 by contact 130. A layer of isolation material 734 is also formed to electrically isolate conductor 730 from 732.

First conductor 730, first contacts 724, and first conductive layers 712, contact 130, and first conductive structure 124 are electrically connected together to form a floating gate/first electrode that is electrically isolated from all other conductors. Second conductor 732, second contacts 726, and second conductive layers 714 form a second electrode, which can be connected to a circuit to operate the cell. Conductive contacts 724 and 726, and conductors 730 and 732 are formed from metal; conductors 730 and 732 can be formed from, for example, the metal-1 layer.

Memory cell 700 operates in the manner described for memory cell 100. By forming capacitive structure 710 to have, for example, ten conductive layers and an overall depth of 2–3 microns, a capacitance value of about 10 fF per square micron of area can be provided. Additionally, the configuration of the capacitive structure allows memory cell 700 to be used with relatively high voltages.

Figure 8A:
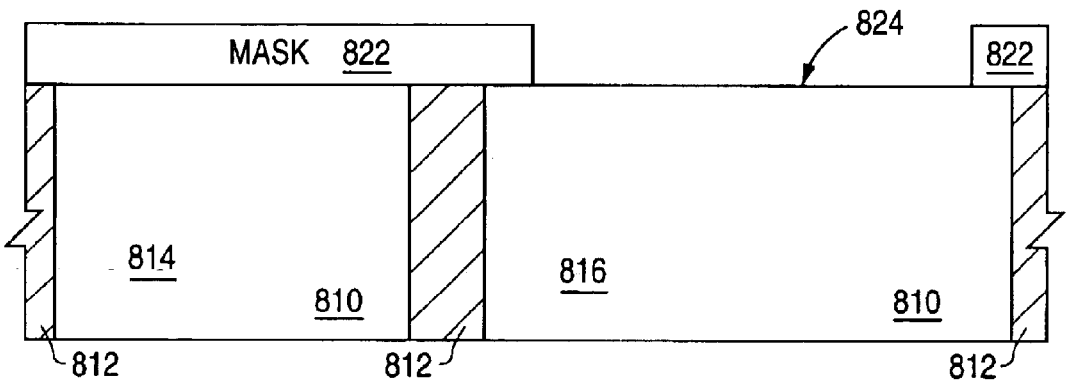
FIGS. 8A–8F are cross-sectional views taken along line 7C–7C of FIG. 7A illustrating an example of a method of forming a memory cell in accordance with the present invention.

FIGS. 8A–8F show cross-sectional views taken along line 7C–7C of FIG. 7A that illustrate an example of a method of forming a memory cell in accordance with the present invention. As shown in FIG. 8A, the memory cell utilizes an n-type semiconductor material 810 which has a trench isolation region 812 that is formed in material 810. Trench isolation region 812 laterally isolates a first region 814 of semiconductor material 810 from a second region 816 of semiconductor material 810.

The method begins by forming a mask 822 on semiconductor regions 814 and 816. Mask 822 then is patterned to expose a portion of a top surface 824 of semiconductor region 816. Mask 822 is patterned to have a triangle-shaped opening in plan view (the mask opening can be patterned in any shape, however, an opening having acute angles, such as a triangle or parallelogram, increases the surface connection area of conductive layers in the to-be-formed capacitive structure). Next, semiconductor material 810 is anisotropically etched to remove portions of the semiconductor material not protected by mask 822. Mask 822 is then removed.

Figure 8B:
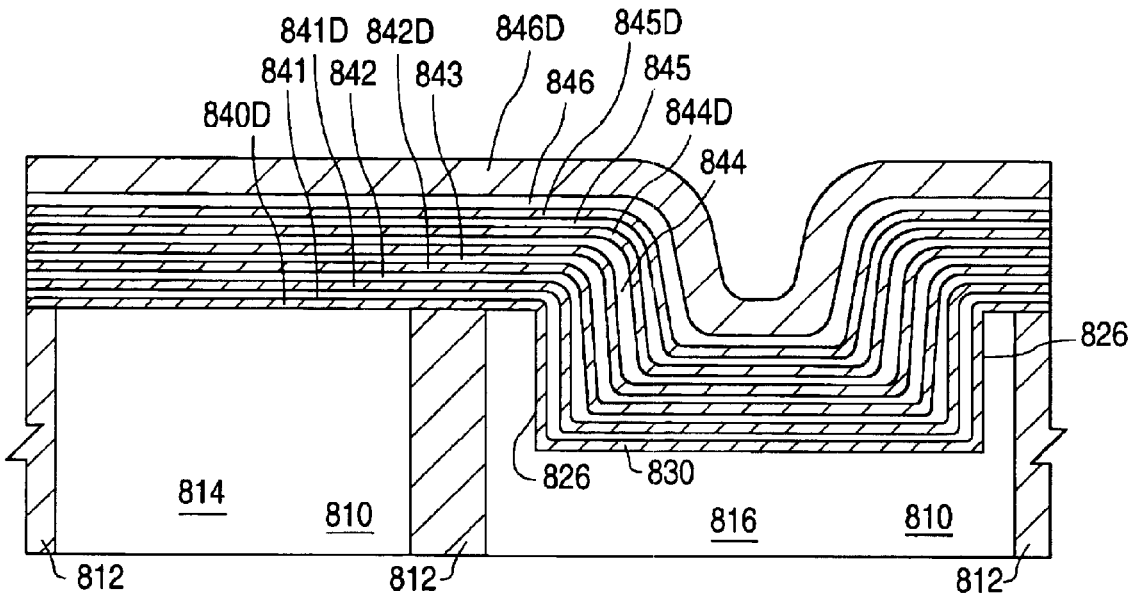

As shown in FIG. 8B, the etch process forms a trench having a plurality of sidewalls 826 and a bottom surface 830. The method continues by forming a first conformal dielectric layer 840D on trench sidewalls 826 and trench bottom 830. Following this, a first conformal conductive layer 841 is formed on first dielectric layer 840D, then a second conformal dielectric layer 841D is formed on conductive layer 841. Alternating conformal conductive layers 841, 842, 843, 844, 845, and 846 and conformal dielectric layers 841D, 842D, 843D, 844D, and 846D are sequentially deposited until the trench is filled.

Figure 8C:
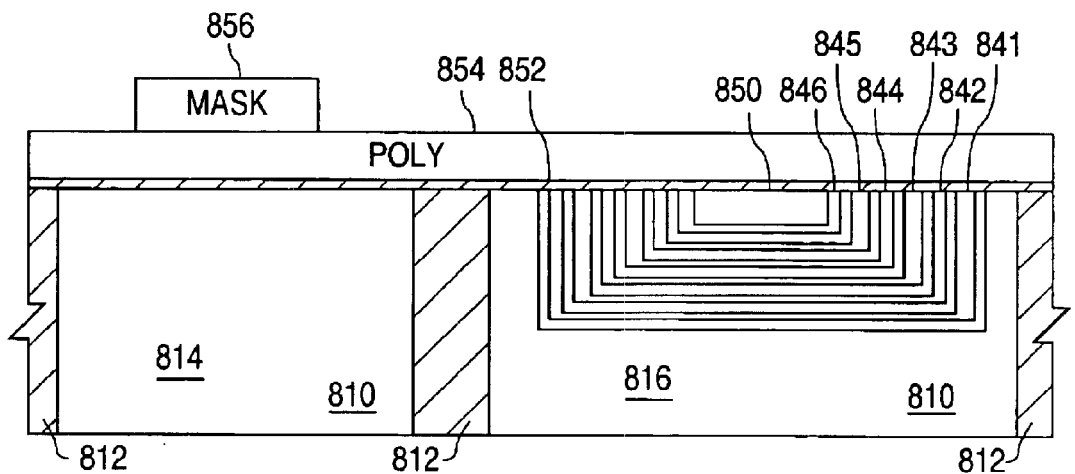

Next, as shown in FIG. 8C, the alternating conformal conductive and dielectric layers, are planarized to create a planar surface 850. Surface 850 includes the surface of semiconductor regions 814 and 816, and the surface of trench isolation region 812. Surface 850 also includes the surfaces of the conformal conductive layers 841–846, and the surfaces of the dielectric layers 841D–846D.

After the planarization step, an insulating layer 852, such as a gate or tunnel oxide, is formed on surface 850. A polysilicon layer 854 is then formed over insulating layer 852, followed by the formation and patterning of a mask 856 on polysilicon layer 854. Polysilicon layer 854 is then anisotropically etched to remove the portions of the layer not protected by mask 856. Mask 856 is then removed.

Figure 8D:
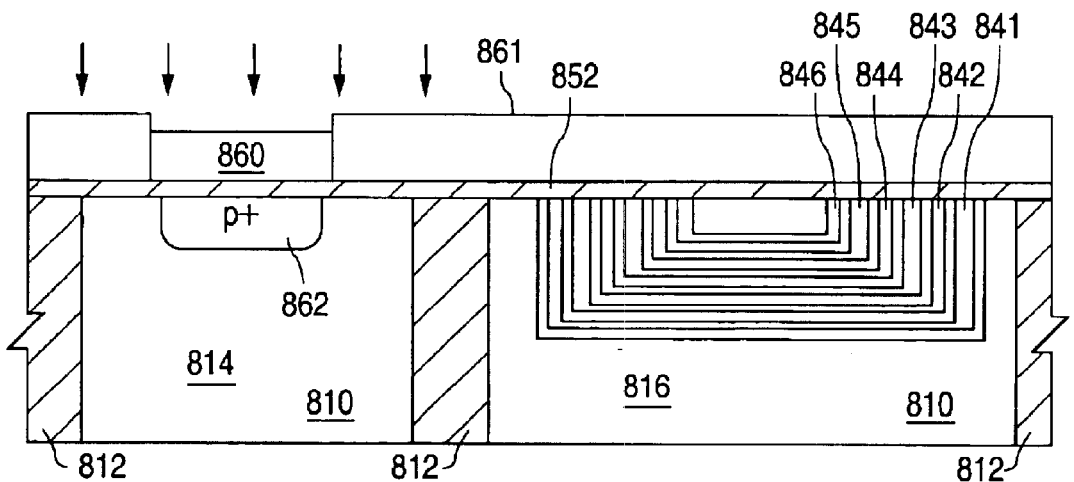

As shown in FIG. 8D, the etch forms a polysilicon conductive structure 860, such as a gate, over semiconductor region 814. After conductive structure 860 has been formed, a mask 861 is formed and patterned on isolation layer 852 to protect conductive layers 841–846. As further shown in FIG. 8D, semiconductor region 816 is then implanted with a dopant to form a p+ drain region 862 and a spaced apart p+ source region (the source region is located on the opposite side of first conductive structure 860, and is thus not shown in the drawing).

The source and drain regions can be formed in a single implant step to form p+ source and drain regions, or in multiple implant steps to form p+/p− source and drain regions. In a multiple implant process, the first implant form p− source and drain regions. A layer of isolation material is next formed, and anisotropicly etched to form side wall spacers. A second implant then forms p+ source and drain regions adjacent to the p− regions. In addition to the source and drain regions, a channel region (also hidden behind drain region 862) is located in semiconductor material 814 between the source and drain regions under conductive structure 860.

Figure 8E:
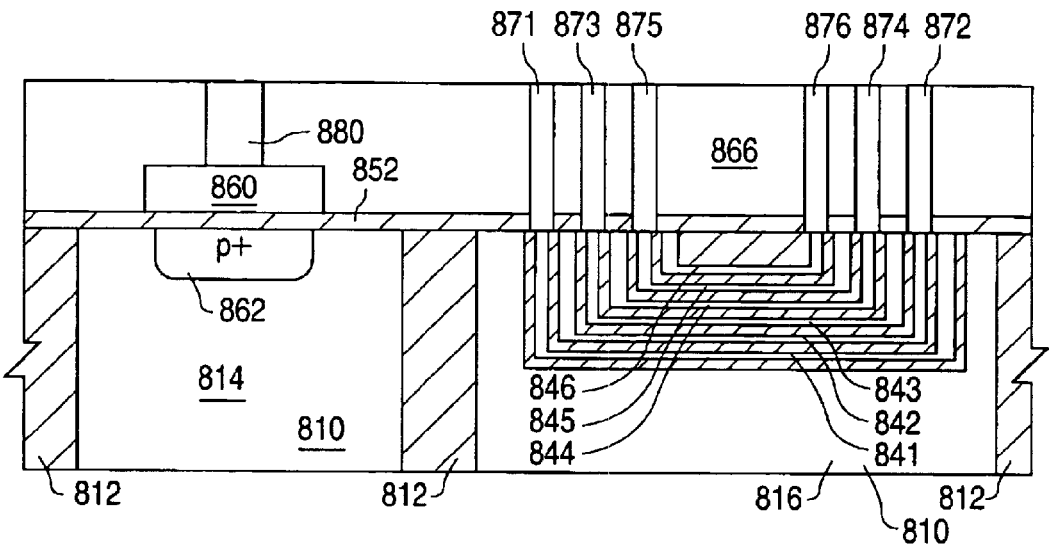

Turning to FIG. 8E, after the source and drain regions have been formed, a layer of isolation material 866 is formed over insulating layer 852 and conductive structure 860. A plurality of conductive contacts 871–876 are then formed through isolation layer 866 so that each contact makes an electrical connection with one of the conformal conductive layers 841–846. Additionally, a conductive contact 880 is formed through isolation layer 866 to make an electrical connection to first conductive structure 860.

Figure 8F:
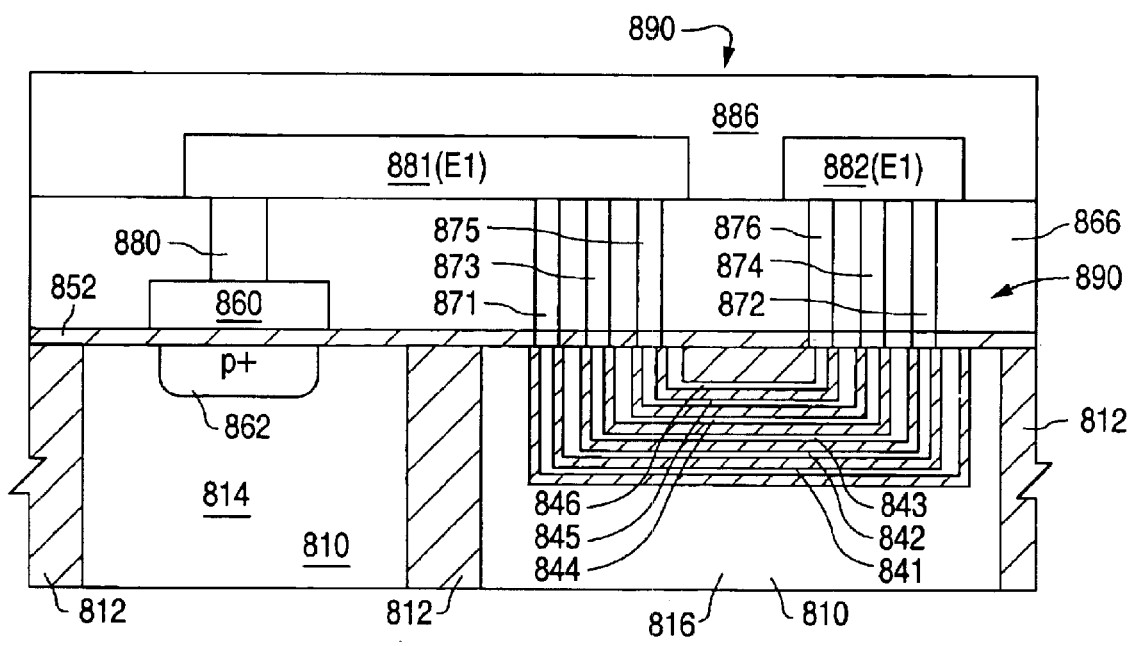

Next, as shown in FIG. 8F, a metal layer, such as the metal-1 layer, is formed on the surface of isolation layer 866, conductive contacts 871–876, and conductive contact 880. The metal layer is masked and etched to form a first conductor 881 that connects conductive contacts 871, 873, and 875 with conductive contact 880. The etch process also forms a second conductor 882 that connects conductive contacts 872, 874, and 876. Second conductor 882 is formed to be connected to a circuit to operate the cell.

Following this, the method continues with conventional steps, with a second layer of isolation material 886 being formed over conductors 881 and 882 to electrically isolate the conductors.

Thus, a capacitive structure 890 is formed. The conductive structure 860, conductive contact 880, conductor 881, conductive contacts 871, 873, and 875, conformal conductive layers 841, 843 and 845 function both as a floating gate which is not electrically connected to any other conductor, and as the first electrode of capacitive structure 890. Conformal conductive layers 842, 844 and 846, conductive contacts 872, 874, and 876, and second conductor 882, in turn, function as the second electrode of capacitive structure 890.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A memory cell comprising:
   a semiconductor material of a first conductivity type;
   spaced apart source and drain regions of a second conductivity type formed in the semiconductor material;
   a channel region located between the source and drain regions;
   a first insulation layer formed over the channel region;
   a first conductive structure formed on the first insulation layer over the channel region;
   an isolation material contacting the first conductive structure; and
   a capacitive structure including:
      a plurality of first horizontal sections, the first horizontal sections being conductive;
      a plurality of first vertical sections connected to the plurality of first horizontal sections such that a first vertical section is connected to each first horizontal section, the first vertical sections being conductive and having different vertical dimensions, a first select horizontal section and a first select vertical section connected to the first select horizontal section being electrically connected to the first conductive structure;
      a plurality of second horizontal sections the second horizontal sections being conductive;
      a plurality of second vertical sections connected to the plurality of second horizontal sections such that a second vertical section is connected to each second horizontal section, the second vertical sections being conductive and having different vertical dimensions; and
      a plurality of dielectric regions, each dielectric region being connected to a first horizontal section a first vertical section, a second horizontal section, and a second vertical section.

2. The memory cell of claim 1 and further comprising a fourth conductive structure formed through the isolation material that contacts the first conductive structure and the first select horizontal section.

3. The memory cell of claim 2 wherein the first, and fourth conductive structures, the first select horizontal section, and the first select vertical section form a first conductive region that is electrically isolated from all other conductors.

4. The memory cell of claim 2 and further comprising a second insulation layer formed on the isolation material, the second insulation layer having an opening that exposes the fourth conductive structure
   the capacitive structure fitting in the opening to contact the fourth conductive structure.

5. The memory cell of claim 2 and further comprising a fifth conductive structure that overlies the plurality of first vertical sections, and is electrically connected to the plurality of first vertical sections.

6. The memory cell of claim 1 wherein the first horizontal sections, the first vertical sections the second horizontal sections, and the second vertical sections are formed in the semiconductor material.

7. The memory cell of claim 6 and further comprising a fifth conductive structure that overlies the plurality of first vertical sections, and is electrically connected to the plurality of first vertical sections, the fifth conductive structure being electrically connected to the first conductive structure.

8. A method of forming a memory cell on a semiconductor material of a first conductivity type, the method comprising the steps of:
   forming spaced apart source and drain regions of a second conductivity type in the semiconductor material, a channel region being located between the source and drain regions;
   forming a first insulation layer over the channel region;
   forming a first conductive structure on the first insulation layer over the channel region;
   forming an isolation material that contacts the first conductive structure;
   forming a first layer of conductive material on a lower horizontal surface and a vertical sidewall surface of an opening to be electrically connected to the first conductive structure;
   forming a first dielectric layer on the first layer of conductive material; and
   forming a second layer of conductive material on the first dielectric layer, the second layer of conductive material having a vertical dimension that is shorter than a vertical dimension of the first layer of conductive material.

9. The method of claim 8 and further comprising the steps of:
   forming a second dielectric layer on the second layer of conductive material;
   forming a third layer of conductive material on the second dielectric layer, the third layer of conductive material having a vertical dimension that is shorter than a vertical dimension of the second layer of conductive material;
   forming a third dielectric layer on the third layer of conductive material; and
   forming a fourth layer of conductive material on the third dielectric layer, the fourth layer of conductive material having a vertical dimension that is shorter than a vertical dimension of the third layer of conductive material.

10. The method of claim 9 and further comprising the steps of:
    forming a first conductor that electrically connects the first and third layers of conductive material; and
    forming a second conductor that electrically connects the second and fourth layers of conductive material.

11. The memory cell of claim 1 wherein the first select horizontal section is formed over and contacts the first conductive structure.

12. The memory cell of claim 11 and further comprising a fifth conductive structure that overlies the plurality of first vertical sections, and contacts a number of the first vertical sections, the fifth conductive structure being electrically connected to the first conductive structure.

13. The memory cell of claim 12 and further comprising a sixth conductive structure that overlies the plurality of second vertical sections, and contacts a number of the second vertical sections, the sixth conductive structure being spaced apart from the fifth conductive structure.

14. The memory cell of claim 13 wherein
    the fifth conductive structure includes a first plurality of contacts that contact the plurality of first sections, and a metal trace that contacts the first plurality of contacts; and the sixth conductive structure includes a second plurality of contacts that contact the plurality of second sections, and a metal trace that contacts the second plurality of contacts.

15. The memory cell of claim 11 wherein each vertical section of the first and second vertical sections has three sidewalls that are connected together to form a triangle.

16. The memory cell of claim 2 wherein each vertical section of the first and second vertical sections has three sidewalls that are connected together to form a triangle.

17. The memory cell of claim 5 and further comprising a sixth conductive structure that overlies the plurality of second vertical sections, and contacts a number of the second vertical sections, the sixth conductive structure being spaced apart from the fifth conductive structure.

18. The memory cell of claim 6 wherein each vertical section of the first and second vertical sections has three sidewalls that are connected together to form a triangle.

19. The memory cell of claim 7 and further comprising a sixth conductive structure that overlies the plurality of second vertical sections, and contacts a number of the second vertical sections, the sixth conductive structure being spaced apart from the fifth conductive structure.

20. The method of claim 10 wherein the opening is formed in the semiconductor material, and the first conductor electrically connects the first conductive structure to the first layer of conductive material.

* * * * *

UNITED STATES PATENT AND TRADEMARK OFFICE
CERTIFICATE OF CORRECTION

PATENT NO. : 6,806,529 B1
DATED : October 19, 2004
INVENTOR(S) : Hopper et al.

It is certified that error appears in the above-identified patent and that said Letters Patent is hereby corrected as shown below:

Column 5,
Line 28, delete "FIGS. SA" and replace with -- FIGS. 5A --.

Column 6,
Line 36, delete "metal-1layer" and replace with -- metal-1 layer --.

Column 7,
Line 21, delete "1,200Åusing" and replace with -- 1,200Å using --.

Column 11,
Line 30, after "sections" insert -- , --.
Line 39, after "section" insert -- , --.
Line 53, after "structure" insert -- , --.
Line 61, after the second occurrence of "sections", insert -- , --.

Signed and Sealed this

First Day of February, 2005

JON W. DUDAS
*Director of the United States Patent and Trademark Office*